(12) United States Patent
Blank et al.

(10) Patent No.: US 12,557,333 B2
(45) Date of Patent: Feb. 17, 2026

(54) SEMICONDUCTOR POWER DEVICE AND METHOD OF MANUFACTURING THE SAME

(71) Applicant: Infineon Technologies Austria AG, Villach (AT)

(72) Inventors: Oliver Blank, Villach (AT); Adrian Finney, Villach (AT); Alessandro Ferrara, Landskron (AT); Franz Hirler, Isen (DE); Stefan Tegen, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 1047 days.

(21) Appl. No.: 17/666,809

(22) Filed: Feb. 8, 2022

(65) Prior Publication Data

US 2022/0262946 A1    Aug. 18, 2022

(30) Foreign Application Priority Data

Feb. 17, 2021 (EP) .................................. 21157608

(51) Int. Cl.
*H10D 30/66* (2025.01)
*H10D 30/01* (2025.01)
*H10D 64/00* (2025.01)

(52) U.S. Cl.
CPC ....... *H10D 30/668* (2025.01); *H10D 30/0297* (2025.01); *H10D 64/117* (2025.01)

(58) Field of Classification Search
CPC ............. H10D 30/668; H10D 30/0297; H10D 64/117; H10D 64/01; H10D 64/112; H10D 64/20
See application file for complete search history.

(56) References Cited

U.S. PATENT DOCUMENTS

| | | | |
|---|---|---|---|
| 6,285,060 B1 | 9/2001 | Korec et al. | |
| 7,633,121 B2 * | 12/2009 | Hshieh | H10D 30/665 438/242 |
| 11,769,828 B2 * | 9/2023 | Harrington, III | H10D 30/668 257/288 |
| 11,862,695 B2 * | 1/2024 | Shin | H10D 30/668 |

(Continued)

FOREIGN PATENT DOCUMENTS

DE    102005041321 A1    3/2007

*Primary Examiner* — Steven B Gauthier
*Assistant Examiner* — Khatib A Rahman
(74) *Attorney, Agent, or Firm* — Murphy, Bilak & Homiller, PLLC (57) ABSTRACT

The disclosure relates to a power device, having a channel region, a gate region formed aside the channel region, for controlling a channel formation, a drift region formed vertically below the channel region, a field electrode formed in a field electrode trench extending vertically into the drift region, wherein the field electrode comprises a first and a second field electrode structure, the first field electrode structure capacitively coupling to a first section of the drift region and the second field electrode structure capacitively coupling to a second section of the drift region, arranged vertically above the first section, the first and the second field electrode structure formed with a vertical overlap and adapted to balance a capacitive coupling between the first and the second field electrode structure and between the field electrode and the drift region.

20 Claims, 10 Drawing Sheets

(56) References Cited

U.S. PATENT DOCUMENTS

| | | | |
|---|---|---|---|
| 11,949,009 B2* | 4/2024 | Vitanov | H10D 84/141 |
| 2004/0135213 A1* | 7/2004 | Yedinak | H10D 64/115 |
| | | | 257/E29.257 |
| 2007/0126056 A1* | 6/2007 | Hirler | H10D 64/117 |
| | | | 257/E29.066 |
| 2007/0138544 A1* | 6/2007 | Hirler | H10D 64/117 |
| | | | 257/E29.183 |
| 2009/0039419 A1* | 2/2009 | Zundel | H10D 30/0297 |
| | | | 438/270 |
| 2010/0213506 A1 | 8/2010 | Willmeroth et al. | |
| 2010/0264486 A1 | 10/2010 | Denison et al. | |

* cited by examiner

SEMICONDUCTOR POWER DEVICE AND METHOD OF MANUFACTURING THE SAME

TECHNICAL FIELD

The present disclosure relates to a semiconductor power device with a channel region and a gate region.

BACKGROUND

The gate region of the power device is formed aside the channel region, it comprises a gate dielectric and a gate electrode. The gate dielectric is arranged in between the channel region and the gate electrode, capacitively coupling the latter to the channel region. Vertically below the channel region, a drift region is formed, a field electrode trench extending into the latter. In this field electrode trench, a field electrode is arranged, capacitively coupling to the drift region.

SUMMARY

It is an object of the present application to provide a power device with improved characteristics, as well as a method of manufacturing such a device.

The field electrode of this device comprises a first and a second field electrode structure, wherein the first field electrode structure couples to a first section of the drift region and the second field electrode structure couples to a second section thereof. In a vertical direction, the first section is arranged below the second section, namely on a greater vertical depth. The stacking of the field electrode structures in the field electrode trench can allow for an integration of a series of low-voltage geometries which together support a higher voltage. In consequence, the dependence of $R_{on} \cdot A$ of the breakdown voltage can, for example, be reduced, e.g. scale basically linearly whereas a device with only one field plate could for instance have an $R_{on} \cdot A$ depending essentially quadratically on the breakdown voltage. In other words, the stacked field electrode structures can allow for an $R_{on} \cdot A$ reduction while maintaining a certain breakdown voltage.

A biasing of the field electrode structures to a required voltage, e.g. to Vds/2 in case of two stacked field electrode structures, can for instance be achieved with a capacitive potential divider. E.g. during faster switching, the capacitors will bias the field electrode structures due to the current flowing through them. This requires the capacity between the field electrode structures to be adjusted to basically the same value as the capacity between the first field electrode structure and the drain region. However, if the field electrode structures would simply be stacked one on the other, the capacitive coupling would be too small due to the comparably small horizontal overlap, e.g. amount to only 20% of the capacity between the first field electrode structure and the drain region.

To increase the capacitive coupling between the first and the second field electrode structure, they are formed with a vertical overlap. This means that a horizontal plane, which lies perpendicular to the vertical direction, intersects both field electrode structures. As discussed in detail below, this shall typically not imply that the vertical overlap is maximized, e.g. by nesting the second field electrode structure over the whole height of the first field electrode structure into the latter. Instead, in particular, the design of the first and the second field electrode structure can aim at a balancing of the coupling between the field electrode structures and between the field electrode and the drift region. If the capacitive coupling between the field electrode structures would become too large for geometrical reasons, a comparably thick dielectric, e.g. thick oxide, would be required in between, which could for example cause an increased mechanical stress in the field electrode trench, and/or could result in an unnecessarily wide trench.

In general words, an approach of this application is to form a field electrode with a first and a second field electrode structure, the latter stacked on the former in the field electrode trench, wherein these field electrode structures are formed with a vertical overlap. In particular, as discussed in detail below, an additional means can be provided for increasing or adapting the capacitive coupling between the field electrode and the drift region. This can for example be the lateral displacement of an overlap section towards the drift region and/or an increased vertical height of a coupling section.

Even though reference is primarily made to the first and the second field electrode structure, more than two field electrode structures can be stacked on each other in the field electrode trench. For the purpose of illustration, a 120 V device can for instance be fabricated from two 60 V devices stacked on each other, but it could also be fabricated from three 40 V devices stacked on each other, the latter resulting in an even lower $R_{on} \cdot A$. In general words, in case of n field electrode structures stacked on each other in the trench, a target can be to bias each field electrode structure to Vds/n.

Particular embodiments and features are presented throughout this disclosure and in particular in the dependent claims. Thereby, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa.

The gate region, which comprises a gate dielectric and a gate electrode, can particularly be formed laterally aside the channel region, e.g. in a trench. In particular, the gate electrode can be arranged in the field electrode trench, namely vertically above the uppermost field electrode structure, e.g. electrically isolated therefrom by an insulating layer. In a lateral direction, the field electrode trench can have a longitudinal extension, it can for instance form a grid-like or in particular stripe-like pattern together with other respective trenches, when seen in a top view. In the trench, in particular seen in a vertical cross section through the trench, the field electrode structures among each other and/or the field electrode structures and the gate electrode are electrically isolated from each other by a respective layer or layers of an insulating material. Between two neighboring trenches, the drift region can in particular have a continuous extension, so that for instance no further compensation structure is formed there.

Generally, when reference to a "vertical cross-section" is made, the cross-sectional plane lies parallel to the vertical direction. The sectional plane can intersect the trench perpendicularly to its longitudinal extension in a lateral direction, e.g. lie perpendicular to the stripes of an aforementioned stripe-design. Generally, the "vertical direction" lies perpendicular to a surface of the device, for instance a surface of the semiconductor body or of a frontside metallization. Independently of the number of field electrode structures stacked and/or of whether the gate electrode is arranged in the trench, the field electrode is electrically isolated from the drift region by a field dielectric. This field dielectric can in particular electrically isolate the lowermost field electrode structure in the trench from the drift region and also from the drain region, e.g. at least in the active region of the device.

Referring to a source and a drain region of a first conductivity type, the channel region can be formed in a body region of a second conductivity type opposite to the first conductivity type. In particular, the source region can be formed at a frontside of the device and the drain region at a backside thereof, the channel region and the drift region arranged vertically between, e.g. the drift region between the channel region and the drain region. The drift region can be of the first conductivity type as well, wherein its dopant concentration is lower compared to the drain region. As a power device, such a transistor can for instance have a breakdown voltage of at least 10 V, 20 V, 30 V, 40 V or 50 V, possible upper limits being for example not more than 800 V, 600 V, 400 V or 200 V.

In an embodiment, an upper overlap section of the first field electrode structure is arranged laterally outside a lower overlap section of the second field electrode structure, namely laterally between the lower overlap section and the drift region. In particular, the upper overlap section can be displaced towards the drift region, an outer sidewall of the upper overlap section being offset laterally outwards compared to an outer sidewall of a coupling section of the second field electrode structure. In other words, the outer sidewalls of the upper overlap section and coupling section do not lie flush with respect to a vertical plane, the upper overlap section sidewall being laterally closer to the drift region. This can allow for the aforementioned balancing of the coupling between the first field electrode structure and the drift region and between the first and the second field electrode structure. Consequently, e.g. the balance of the capacitive potential divider can be improved. The capacitor formed by the upper overlap section can be required to support only a small potential difference, e.g. a few volts, between the first field electrode structure and drift region. Consequently, a standard dielectric material can be used, for instance oxide, and/or only one field oxide thickness is required (e.g. around 300 nm). Generally, an "outer" sidewall of a field electrode structure is a sidewall facing towards the drift region, wherein an "inner" sidewall faces away from the drift region.

In an embodiment, an outer sidewall of the upper overlap section of the first field electrode structure is offset laterally outwards compared to an outer sidewall of a coupling section of the first field electrode structure. In other words, the outer sidewall of the first field electrode structure is closer to the drift region in an overlap section than in a coupling section of the first field electrode structure. The coupling section of the first field electrode structure is arranged at a greater vertical depth than its overlap section. In this embodiment, the first field electrode structure can in particular be the lowermost field electrode structure in the trench, the coupling section coupling solely to the drift region, not to a further field electrode structure. In combination with the embodiment described above, the outer sidewall can be closer to the drift region in the overlap section than in a coupling section below (of the first field electrode structure) and the coupling section above (of the second field electrode structure).

In an embodiment, a first dielectric thickness, which is taken laterally between the upper overlap section of the first field electrode structure and the drift region is smaller than
- a second dielectric thickness taken laterally between a coupling section of the first field electrode structure and the drift region, and/or
- a third dielectric thickness taken laterally between a coupling section of the second field electrode structure and the drift region, and/or
- a fourth dielectric thickness taken laterally between the upper overlap section of the first field electrode structure and the lower overlap section of the second field electrode structure.

In case that a respective lateral distance varies along the vertical extension of the respective section, a mean value taken over the vertical extension of the respective section is considered. Particularly, however, the first and/or second and/or third and/or fourth dielectric thickness can be constant over the respective section.

In an embodiment, which can be combined with or be an alternative to the lateral displacement of the outer sidewall discussed above, a vertical height of the coupling section of the first field electrode structure is larger than the lateral width of its upper overlap section. In other words, a (vertical) thickness of a layer forming the coupling section is larger than the (lateral) thickness of a layer forming the upper overlap section. The vertical height or vertical layer thickness can for instance be at least 2 times, 3 times or 4 times larger than the lateral width or lateral layer thickness, wherein possible upper limits can for instance be not more than 20 times, 15 times or 10 times.

As discussed above, the coupling section of the first field electrode structure is formed on a smaller vertical height than its overlap section, namely arranged at a greater depth. This shall not imply that the coupling section has a smaller vertical extension than the overlap section, which is possible, but not mandatory. Generally, in its overlap section, a respective field electrode structure capacitively couples to another field electrode structure. Additionally, this overlap section, in particular upper overlap section, can also capacitively couple to the drift region, e.g. couple laterally outwards to the drift region and laterally inwards to the overlap section of the other field electrode structure. In contrast to an overlap section, a respective coupling section of a respective field electrode structure can couple solely to the drift region in the lateral direction. A horizontal plane through the coupling section intersects for instance solely the respective field electrode structure, e.g. no other field electrode structure being intersected by the horizontal plane.

As discussed above, more than two field electrode structures can be stacked in the field electrode trench, wherein the "first" field electrode structure is not necessarily the lowermost field electrode structure in the trench. Below, a further field electrode structure can be arranged, which can in particular have a vertical overlap with the first field electrode structure. In this example, an upper overlap section of the further field electrode structure, which forms the vertical overlap with the first field electrode structure, can be formed above a coupling section of the further field electrode structure. Alternatively, however, the first field electrode structure can also be the lowermost one in the trench.

In an embodiment, the coupling section of the first field electrode structure has a vertical height which is at least 0.2 times the vertical height of the upper overlap section of the first field electrode structure. Further possible lower limits are 0.3 times, 0.4 times, 0.5 times, 0.6 times or 0.7 times the vertical height of the upper overlap section. Independently of these lower limits, the vertical height of the coupling section can be not more than 10 times, 8 times, 6 times, 4 times, 3 times, 2 times, 1.8 times, 1.7 times, 1.6 times, 1.5 times, 1.4 times or 1.3 times the vertical height of the upper overlap section.

In an embodiment, a fourth dielectric thickness, which is taken laterally between the upper overlap section of the first field electrode structure and the lower overlap section of the second field electrode structure, is smaller than a second dielectric thickness taken laterally between the coupling section of the first field electrode structure and the drift region. The fourth dielectric thickness can for instance be 1.2 µm at maximum, in particular 1 µm, 0.8 µm, 0.6 µm, 0.5 µm or 0.4 µm at maximum. Possible lower limits are 0.05 µm, 0.1 µm or 0.2 µm at minimum, wherein these absolute values can also depend from the voltage class.

In an embodiment, an outer wall face of the second field electrode structure has an oblique and/or stepped extension in a transition section of the second field electrode structure. This transition section is arranged vertically between the lower overlap section and the coupling section of the second field electrode structure, and the oblique/stepped shape can for instance result from an advantageous method of manufacturing, see in detail below. In this respect, "obliquely" means tilted with respect to the vertical and the lateral direction, namely neither parallel nor perpendicular to one of them. Due to the "stepped" design, an edge can be formed between a horizontal and a vertical subsection of the transition section.

In an embodiment, the doping concentration in the drift region has a gradient in the first section, to which the first field electrode structure capacitively couples, and/or in the second section, to which the second field electrode structure capacitively couples. If more than two field electrode structures are stacked in the trench, the doping concentration can have a gradient in more than two sections of the drift region, it can in particular have a gradient in each section of the drift region, to which a respective field electrode structure couples. Independently of these details, the doping concentration can in particular be lower at the upper end of a respective coupling section than at the lower and thereof. In a vertical direction downwards, the doping concentration can increase within a respective section of the drift region, and it can decrease between two respective sections, e.g. basically stepwise. In other words, the doping concentration can basically follow a sawtooth-profile. In general, however, a constant doping profile can also be provided.

In an embodiment, a dielectric layer arranged between the first and the second field electrode structure is made of another dielectric material than a field dielectric formed between the field electrode and the drift region. The upper overlap section of the first field electrode structure and the lower overlap section of the second field electrode structure can be capacitively coupled via the dielectric layer. The dielectric material of this dielectric layer can in particular have another dielectric constant than the field dielectric material, which can offer a (further) possibility to adjust or balance the capacitive coupling between the field electrode structures compared to the coupling to the drift region. By way of example, the field dielectric material can be silicon oxide, wherein silicon nitride having around twice the dielectric constant can be chosen for the dielectric layer.

In an embodiment, the capacity between the first and the second field electrode structure is set to the capacity between the first field electrode structure and the drain region. In other words, these capacities can have basically the same value. If a third field electrode structure is stacked on the second one, the capacity value between these can in particular be set to the capacity value between the first and the second field electrode structure. In other words, if at least three field electrode structures are stacked, the at least two capacities formed in this chain can in particular have the same value. As discussed above, this can for instance bias the field electrode structures at basically the same voltage values, in particular during faster switching.

In an embodiment, the device comprises a resistor connected in parallel with the capacitor formed by the first and the second field electrode structure. If more than two field electrode structures are stacked, a chain of capacitors being formed, a respective resistor can be connected in parallel with each of the capacitors, wherein these capacitor/resistor pairs can be connected in series. With this RC-coupling, the desired voltage drop can be achieved during static or slow switching operation (resistive voltage divider) and during faster switching (capacitive potential divider). In general, and external resistor or resistors are conceivable, particularly it or they can be integrated into the semiconductor body.

The method of manufacturing the power device can comprise
 i) etching the field electrode trench;
 ii) forming the first field electrode structure;
 iii) depositing a dielectric material to form a dielectric layer;
 iv) forming the second field electrode structure Depending on the total number of field electrode structures to be formed in the trench, the dielectric layer formation (step iii) and the field electrode structure formation (step iv) can be repeated accordingly. Independently of the total number of field electrode structures formed in the trench, the gate electrode can be formed after and above the uppermost field electrode structure in the field electrode trench, which will also depend on the specific device design, as discussed above.

Forming a field electrode structure with a coupling section and an overlap section below and/or an overlap section above will typically require a plurality subsequent processing steps, the different sections formed one after the other. In an embodiment, for forming the upper overlap section of a respective field electrode structure, a layer of a field electrode structure material is deposited onto a preliminary field electrode trench sidewall. This preliminary trench sidewall can for instance be the inner sidewall of a field dielectric deposited onto and/or formed on or at the initial trench sidewall resulting after the trench etch (as discussed above, the inner sidewall faces away from the drift region). With the deposition of the field electrode structure material, e.g. doped polysilicon, a layer of the field electrode structure material is formed on the preliminary field electrode trench sidewall.

Subsequently, a masking material is deposited to cover a lower section of this layer e.g. a resist fill. The masking material can initially fill the trench completely and can be etched back to cover only the lower section of the field electrode structure material layer and, vice versa, to expose an upper section thereof. When the lower section of the field electrode structure material is protected by the masking material, the upper section can be etched away, for instance by dry etching, e.g. isotropic silicon dry etch, or by wet etching. After this etch step, the upper overlap section of the respective field electrode structure remains, and the masking material can be removed, e.g. the resist be stripped.

To manufacture an aforementioned device with the sidewall of the field electrode being offset towards the drift region in the upper overlap section, e.g. compared to the sidewall of the coupling section below and/or above, a further etch step can be introduced prior to the deposition of the field electrode structure material layer onto the preliminary trench sidewall. With this etch step, the thickness of the field dielectric layer formed at/deposited onto the initial trench sidewall can be reduced, for instance by at least 20% or 30%, possible upper limits being for example not more than 80% or 70%. The field dielectric thickness can for instance be reduced by wet etching. In the coupling section of the respective field electrode structure, namely below the overlap section, the initial field dielectric thickness will remain, the inner sidewall of the field dielectric being protected by the field electrode structure material forming the coupling section of the respective field electrode structure. After forming the overlap section of the respective field electrode structure in the way described above and prior to forming the coupling section of the subsequent field electrode structure, the field dielectric thickness can be increased again, e.g. by an oxide deposition.

Prior to forming the upper overlap section of the respective field electrode structure, its coupling section can be formed. For that purpose, the field electrode structure material can be deposited into the trench to fill the respective section completely, e.g. continuously between two opposite preliminary field electrode trench sidewalls. This can for instance be achieved by a complete fill of the trench with the field electrode structure material in combination with a subsequent etch back to adjust the desired height of the coupling section. After the formation of the upper overlap section of the respective field electrode structure, a layer of a dielectric material can be deposited to form the dielectric between the respective field electrode structure and the subsequent field electrode structure, the lower overlap section of the subsequent field electrode structure can be formed by a deposition of field electrode structure material.

In an embodiment, a layer of dielectric material, which is deposited onto the preliminary trench sidewall when the dielectric layer between two respective field electrode structures is formed, is etched away subsequently. In particular, it can be etched away after field electrode structure material has been deposited to form the lower overlap section of the second or generally subsequent field electrode structure. In consequence, the outer wall face of the second or subsequent field electrode structure can have the oblique and/or stepped shape in the transition region, as discussed above. With this etch step, the dielectric thickness between the coupling section of the second or subsequent field electrode structure and the drift region can be adjusted independently of the dielectric layer thickness between the field electrode structures.

BRIEF DESCRIPTION OF THE DRAWINGS

Below, the power device and the manufacturing of the same are explained in further detail by means of exemplary embodiments. Therein, the individual features can also be relevant in a different combination.

DETAILED DESCRIPTION

Figure 1:
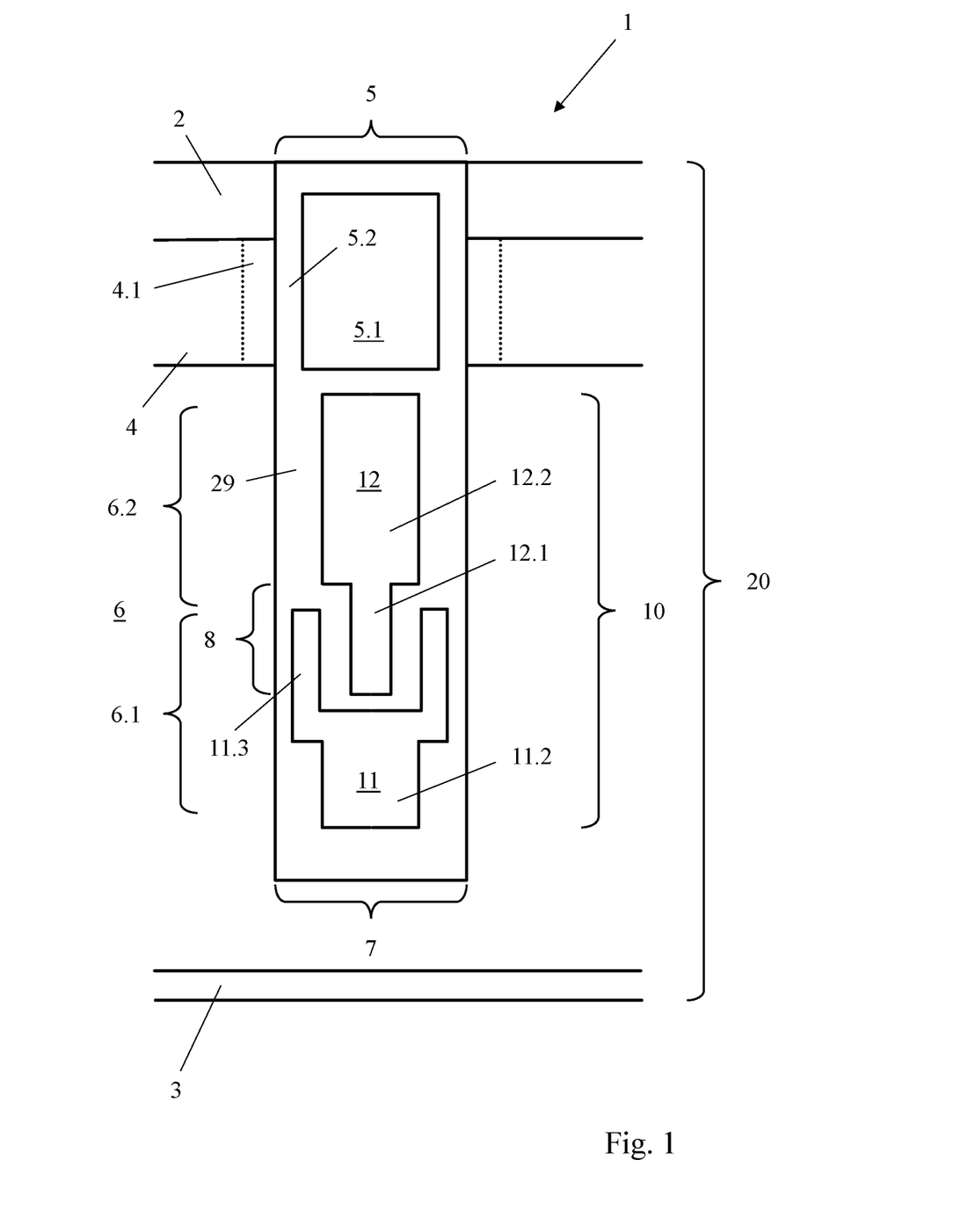
FIG. 1 shows a power device with two field electrode structures, illustrating a vertical overlap and lateral sidewall displacement in the overlap section.

FIG. 1 shows a power device 1 having a source region 2 and a drain region 3, wherein a body region 4 and a drift region 6 are formed vertically in between. In the example shown, the body region 4 is p-doped, whereas the source region 2, the drain region 3 and the drift region 6 are n-doped, the drift region 6 with a lower doping concentration than the drain region three. Moreover, the device 1 comprises a gate region 5 formed aside a channel region 4.1 of the body region 4. The gate region 5 comprises a gate electrode 5.1 and a gate dielectric 5.2, which capacitively couples the gate electrode 5.1 to the channel region 4.1. By applying a voltage to the gate electrode 5.1, a channel formation and vertical current flow through the channel region 4.1 and, in consequence, between a source region 2 and a drain region 3 can be controlled.

In addition, the device 1 comprises a field electrode 10 which is formed in a field electrode trench 7 extending into the drift region 6, namely into the semiconductor body 20. In the example shown, the gate electrode 5.1 is arranged above the field electrode 10 in the field electrode trench 7. The field electrode comprises a first field electrode structure 11 and a second field electrode structure 12 formed above. In the example shown, the first field electrode structure 11 is the lowermost one and the second field electrode structure 12 is the uppermost one, even though more than two field electrode structures 11, 12 can be stacked on each other as detailed below.

Via a field dielectric 29, the first field electrode structure 11 capacitively couples to a first section 6.1 of the drift region six, and the second field electrode structure 12 capacitively couples to a second section 6.2 of the drift region 6/thereof. As discussed in the general description in detail, the stacked field electrode structures 11, 12 can allow for a serial integration of lower voltage geometries, e.g. 60 V, which together support a higher voltage, e.g. 2×60 V in this example. To realize a capacitive voltage divider, e.g. with basically the same capacity between the field electrode structures 11, 12 and between the first field electrode structure 11 and the drain region 3, the field electrode structures 11, 12 are formed with a vertical overlap 8 to increase their capacitive coupling. The vertical overlap 8 is formed between an upper overlap section 11.3 of the first field electrode structure 11 and a lower overlap section 12.1 of the second field electrode structure 12, wherein the upper overlap section 11.3 is arranged laterally outside of the lower overlap section, embracing the latter in the vertical cross-section shown. A coupling section 11.2 of the first field electrode structure 11 is formed below its upper overlap section 11.3, and a coupling section 12.2 of the second field electrode structure 12 is formed above its lower overlap section 12.1.

The vertical overlap 8 increases the capacitive coupling between the field electrode structures 11, 12. This coupling could even become too large compared to the coupling to the drift region 6, e.g. if the vertical overlap 8 would extend over the whole height of the first field electrode structure. For that reason, the device 1 shown aims at balancing the respective coupling, in the example of FIG. 1 by a lateral displacement of the upper overlap section 11.3 towards the drift region.

Figure 2:
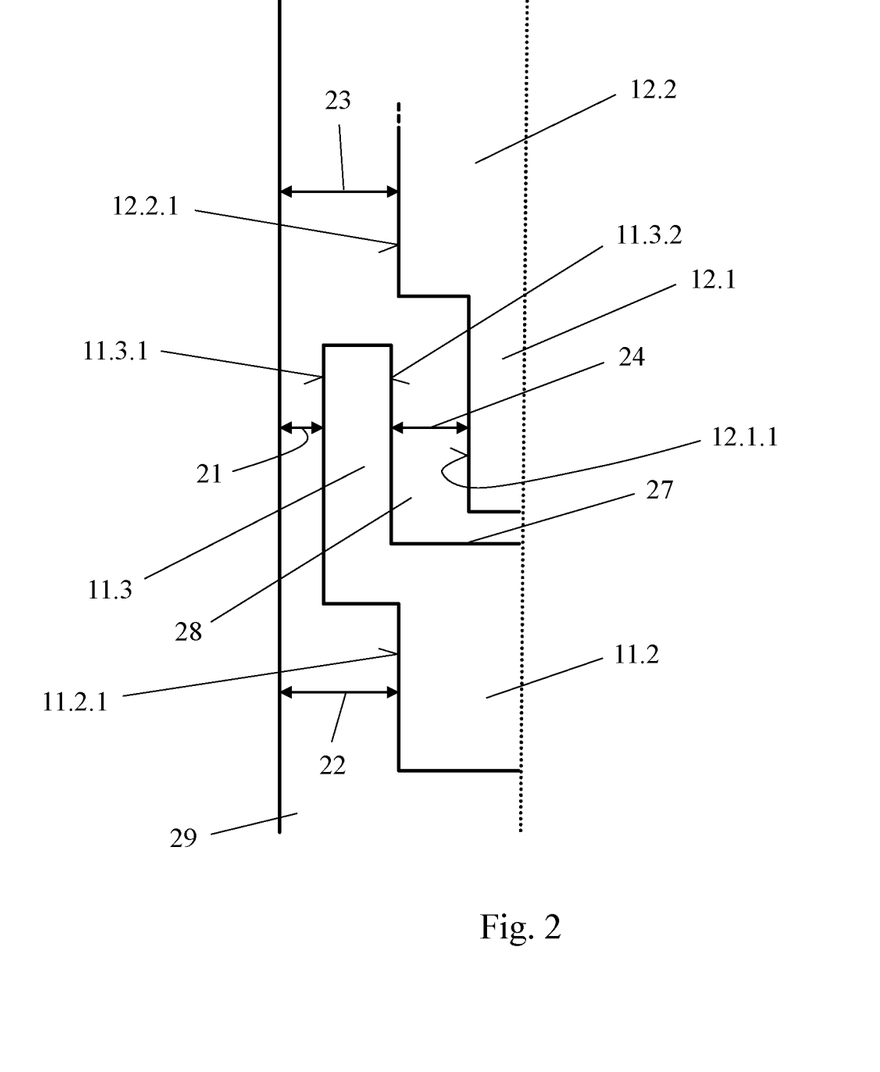
FIG. 2 shows a detailed view of the field electrode structures of FIG. 1.

FIG. 2 shows an enlarged view of the field electrode structures 11, 12 and illustrates the lateral displacement in detail. Compared to an outer sidewall 12.2.1 of the coupling section 12.2 of the second field electrode structure 12 and an outer sidewall 11.2.1 of the coupling section 11.2 of the first field electrode structure 11, the outer sidewall 11.3.1 of the upper overlap section 11.3 of the first field electrode structure 11 is offset laterally outwards. A first dielectric thickness 21 taken laterally between the upper overlap section 11.3 and the drift region 6 can be smaller than a second and/or third dielectric thickness 22, 23, the former taken between the drift region 6 and the coupling section 11.2, the latter between the drift region 6 and the coupling section 12.2.

By way of example, the first dielectric thickness 21 can be around only 20% of the second/third dielectric thickness 22, 23, e.g. 50 nm versus 300 nm. Moreover, the first dielectric thickness 21 can be smaller than a fourth dielectric thickness 24 taken between the overlap sections 11.3, 12.1. In particular, the fourth dielectric thickness 24 is taken between an inner sidewall 11.3.2 of the overlap section 11.3 and an outer sidewall 12.1.1 of the overlap section 12.1, the inner sidewall 11.3.2 facing away from the drift region 6, in contrast to the outer sidewalls 12.1.1, 11.3.1 and 11.2.1. In this drawing, a central upward facing face 27 of the first field electrode structure 11 is drawn as a straight line. However, it can have a sloped and/or curved shape, e.g. slope from both sides towards the center downwards and/or have a rounded edge at each side, namely at the transition into the inner sidewall 11.3.2, e.g. a convex edge rounding.

Figure 3:
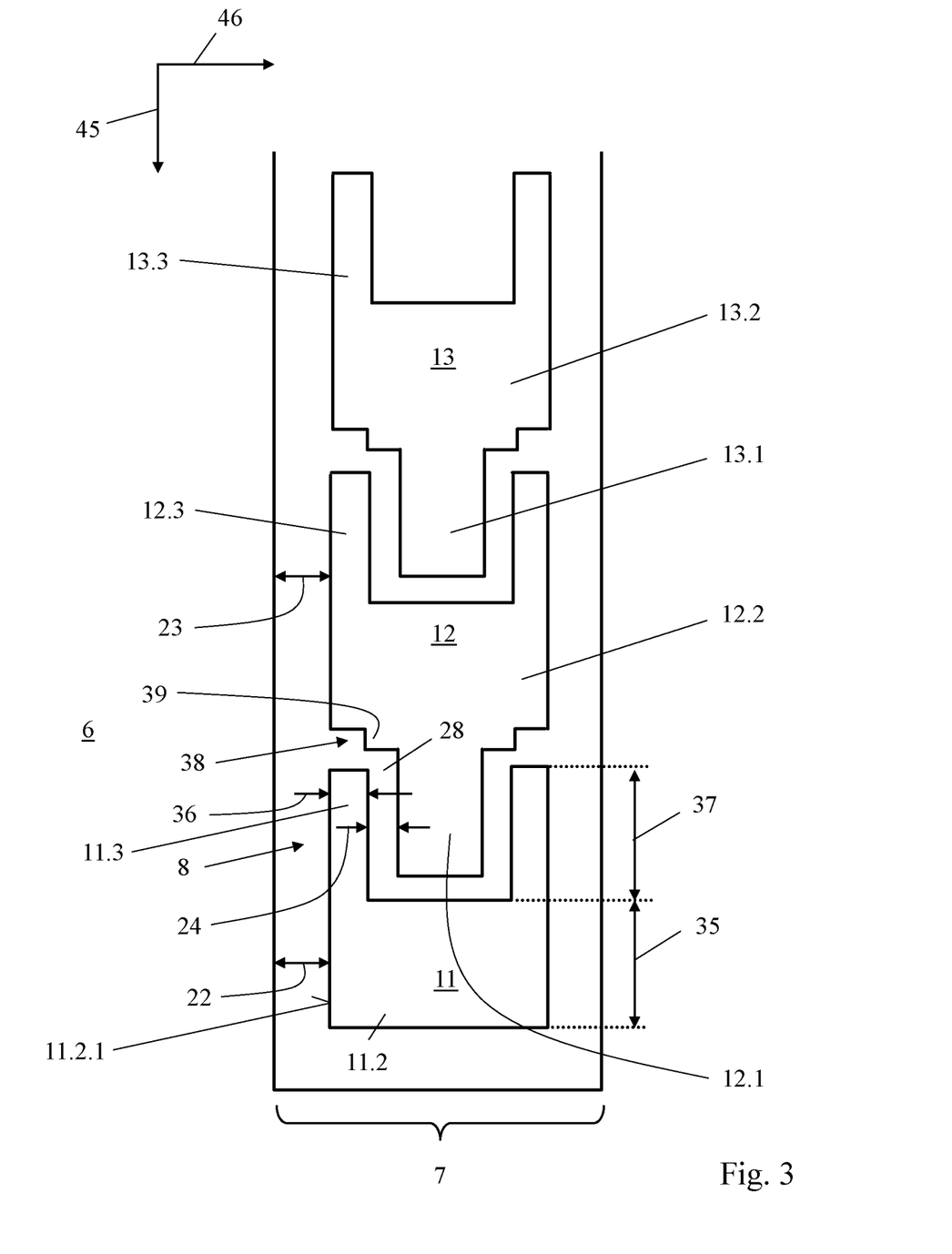
FIG. 3 illustrates stacked field electrode structures of another device, illustrating a vertical overlap and an increased coupling section height.

FIG. 3 illustrates a further embodiment with a field electrode 10 in a field electrode trench 7. Apart from the specific differences discussed below, the device as a whole can have the same set up as illustrated in FIG. 1. As discussed above, field electrode structures 11, 12 are formed with a vertical overlap 8 to increase the capacitive coupling between the field electrode structures 11, 12. As discussed further above, the coupling between the field electrode structures 11, 12 could become too large, if the vertical overlap 8 would extend over the whole height of the first field electrode structure 11. This would be the case, if a bottom portion of the first field electrode structure 11 would have, taken in a vertical direction 45, basically the same thickness as the upper overlap section 11.3 has in a lateral direction 46, which could result from a deposition of the bottom portion and the upper overlap section 11.3 as a layer in the same process step.

In FIG. 3, the coupling section 11.2 is in contrast formed with a vertical height 35 which is larger than the lateral width 36 of the overlap section 11.3. In other words, the first field electrode structure 11 is formed with a socket, so that the (vertical) layer thickness of the socket or bottom portion, namely of the coupling section 11.2, is larger than a lateral layer thickness of the overlap section 11.3. By increasing the vertical height 35 of the coupling section 11.2, the coupling to the drift region 6, and in particular to the drain region 3 can be adjusted, e.g. independently of the coupling between the field electrode structures 11, 12.

Depending on the design in detail, the vertical height 35 can be comparable to the vertical height 37 of the upper overlap section, e.g. be between 0.7-1.3 times the latter. Due to this geometry, the coupling between field electrode structures 11, 12 does not become too large, so that a dielectric layer 28 between the field electrode structures 11, 12 can be comparably small (no increased thickness required for counterbalancing). The fourth dielectric thickness 24 can even be smaller than the second and/or third dielectric thickness 22, 23.

Between the lower overlap section 12.1 and the coupling section 12.2, an outer wall face 38 of the second field electrode structure 12 extends with a step 39. Alternatively or in addition, it could extend obliquely, tilted with respect to the vertical and the horizontal direction 45, 46. Above the second field electrode structure 12, a third field electrode structure 13 is arranged, having a lower overlap section 13.1, a coupling section 13.2 and, depending on whether a further field electrode structure (not shown) is arranged above, an upper overlap section 13.3.

Figure 4:
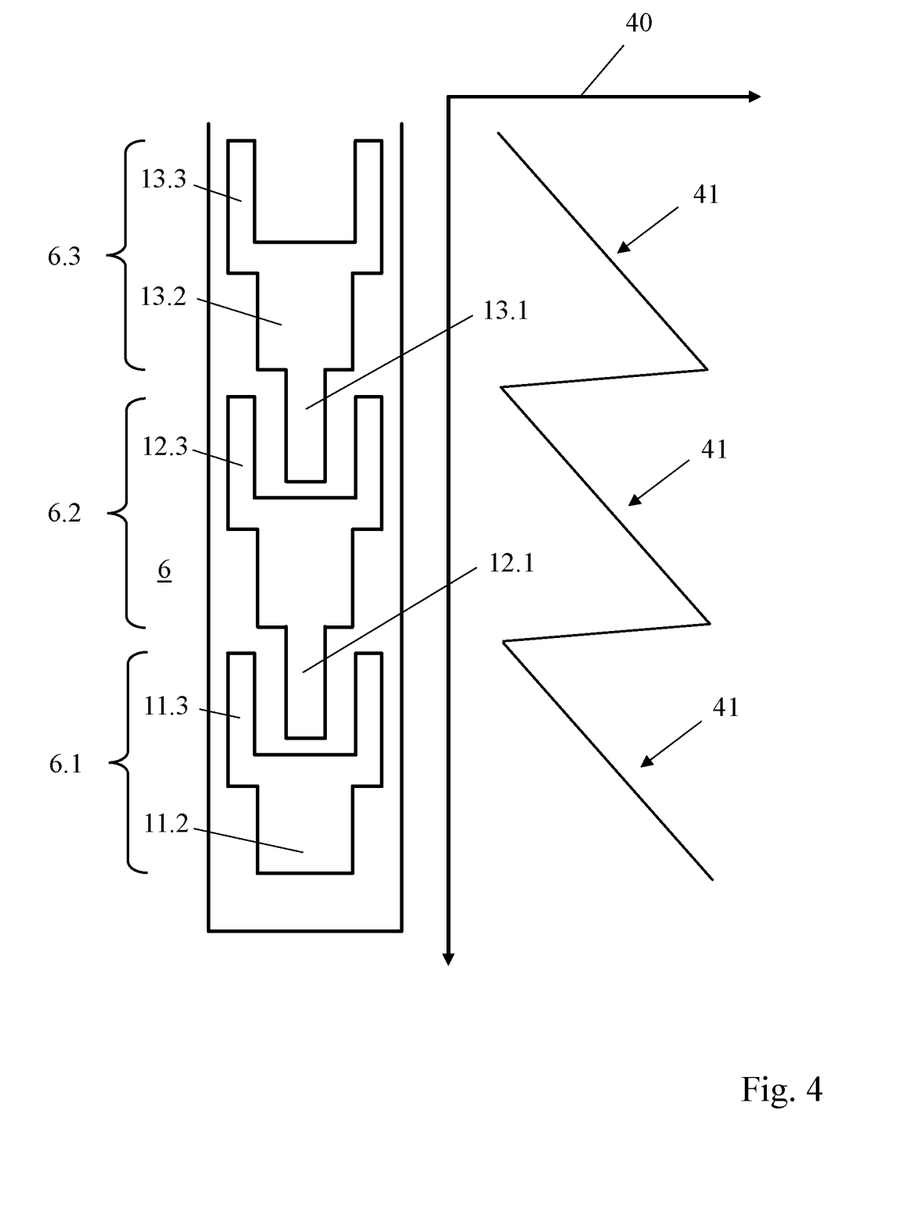
FIG. 4 illustrates field electrode structures comparable to those of FIGS. 1 and 2 and illustrates a doping concentration gradient in the drift region.

FIG. 4 also shows three stacked field electrode structures 11-13, which respectively have an upper overlap section 11.3-13.3 as discussed with reference to FIGS. 1 and 2. In addition, FIG. 4 illustrates a doping concentration 40 in the drift region 6. The doping concentration 40, which is shown on a logarithmic scale, has a gradient 41 in each of the sections 6.1-6.3. For each of the field electrode structures 11-13 or sections 6.1-6.3, the doping concentration 40 is lower at the respective upper end and increases towards the respective lower end, for instance by around one order of magnitude. Between two sections 6.1-6.3, the doping concentration 40 decreases again, e.g. basically in a step function, the logarithmically plotted doping concentration 40 having for instance a sawtooth profile.

Figure 5A:
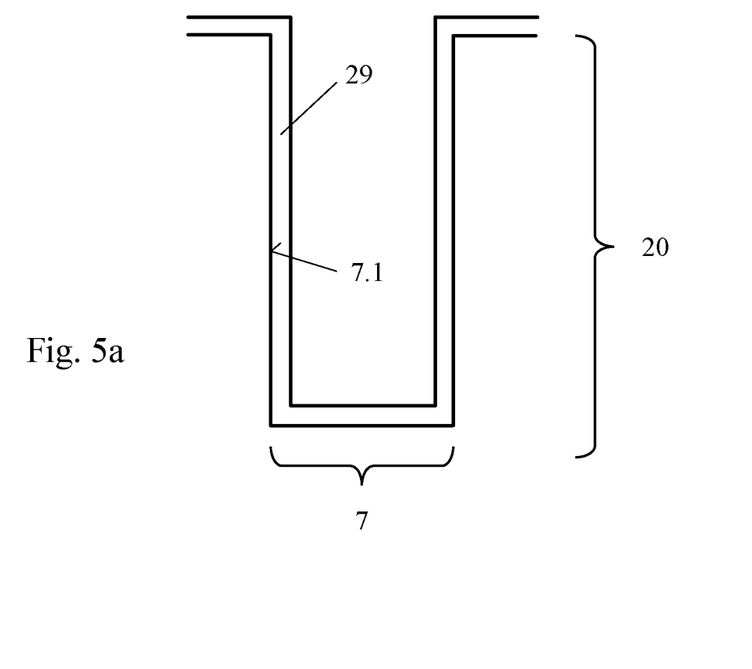
FIGS. 5a-h illustrate some processing steps for manufacturing the field electrode structures of FIG. 3.

FIGS. 5a-h illustrate several process steps for manufacturing field electrode structures as shown in FIG. 3. In FIG. 5a, the field electrode trench 7 has been etched into the semiconductor body 20, and the field dielectric 29 has been formed at the sidewall 7.1 of the field electrode trench 7. The field dielectric formation can for instance be a thermal oxidation, e.g. combined with a subsequent TEOS deposition.

Figure 5B:
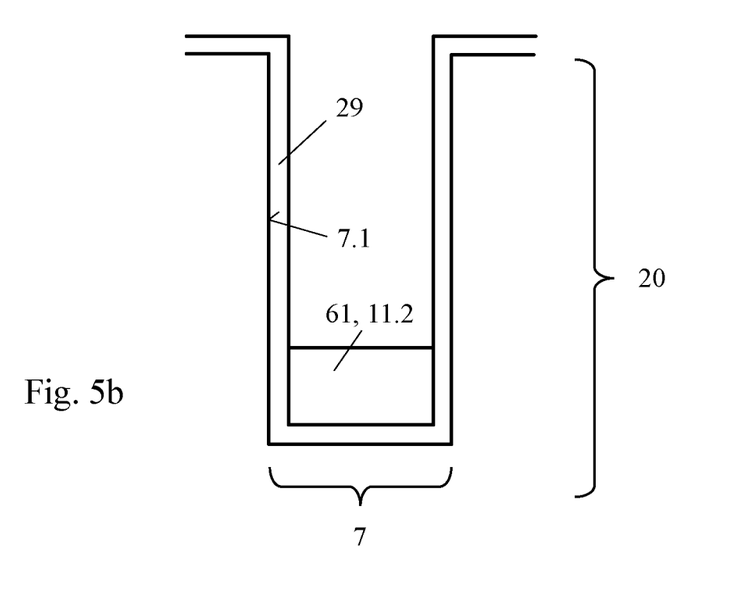
Figure 5C:
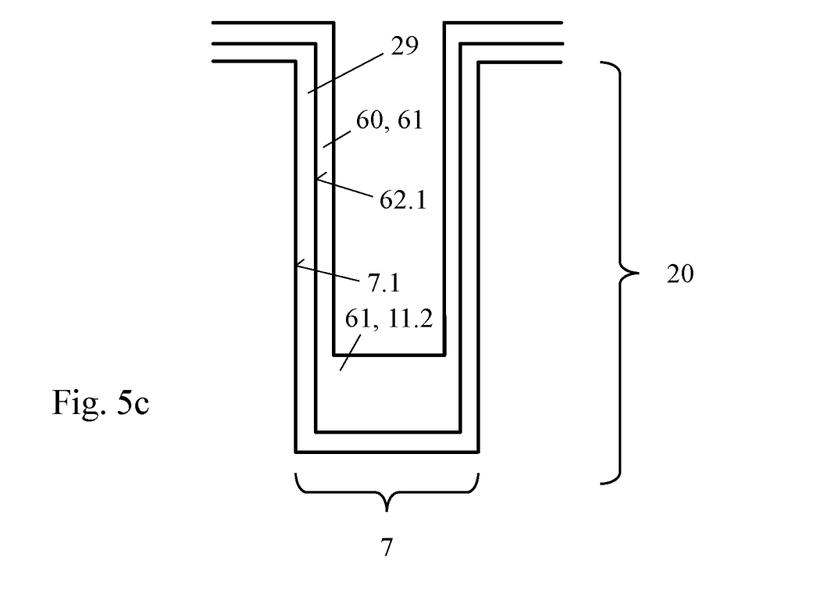

In FIG. 5b, a field electrode structure material 61 has been deposited into the field electrode trench 7 to form a part of the first field electrode structure 11. In detail, prior to the situation shown in FIG. 5b, the field electrode structure material 61 filled the trench 7 completely, and it has been etched back to fill only the bottom portion. Likewise, the coupling section 11.2 of the first field electrode structure 11 is defined. After this etch back step, a layer 60 of the field electrode structure material 61 is deposited, covering a frontside of the semiconductor body 20 and a preliminary field electrode trench sidewall 62.1, as shown in FIG. 5c. The latter is the inner sidewall of the field dielectric 29, which faces away from the drift region 6.

Figure 5D:
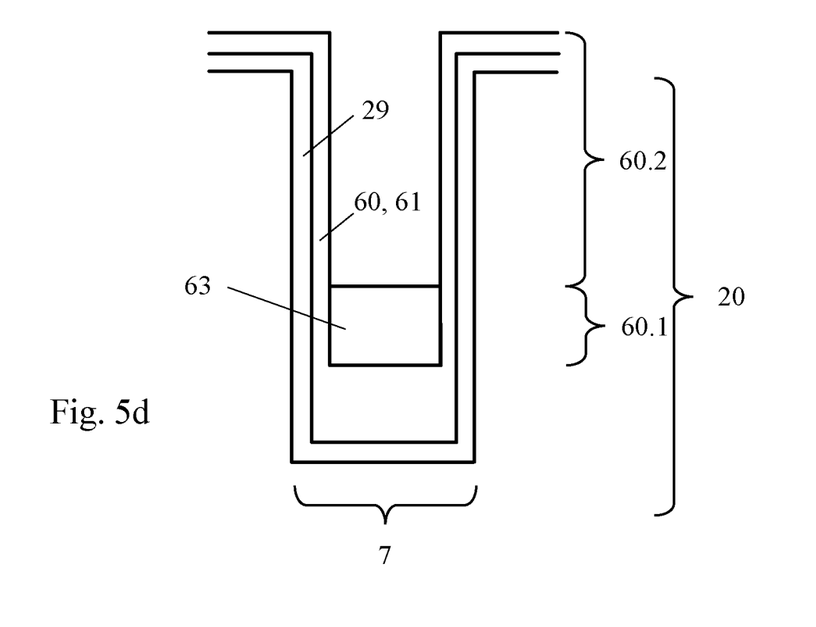
Figure 5E:
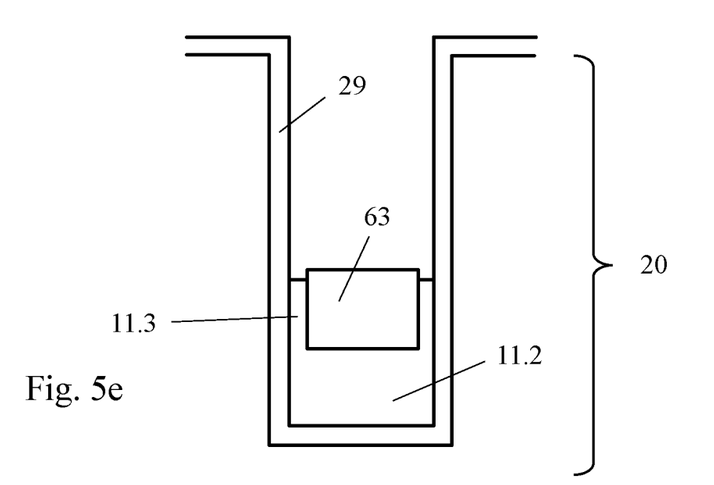

Subsequently, a masking material 63 is deposited. The masking material 63 can for instance be a resist, e.g. photoresist. Initially, it fills the field electrode trench 7 completely, and it is etched back to arrive at the situation shown in FIG. 5d. There, it covers only a lower section 60.1 of the layer 60, while an upper section 60.2 is exposed. Subsequently, the field electrode structure material 61 is etched away in the upper section 60.2, for instance by wet etching or in particular dry etching. This etch step defines the upper overlap section 11.3 of the first field electrode structure, as shown in FIG. 5e.

Figure 5F:
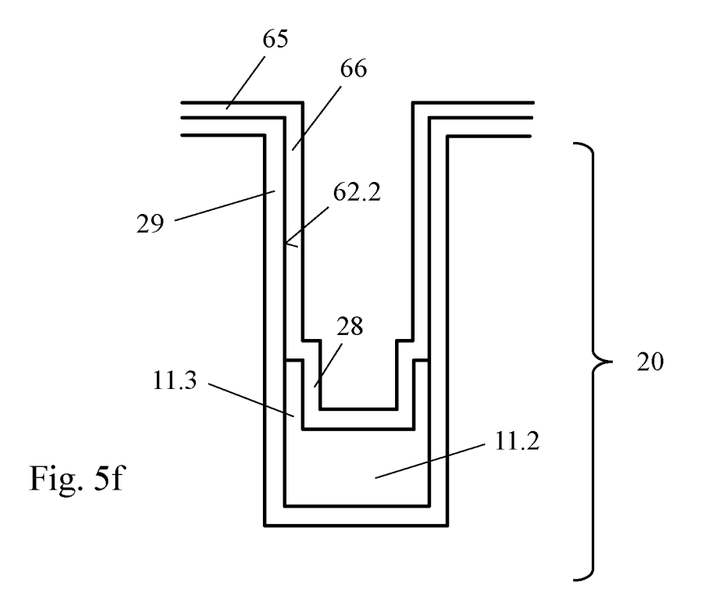
Figure 5G:
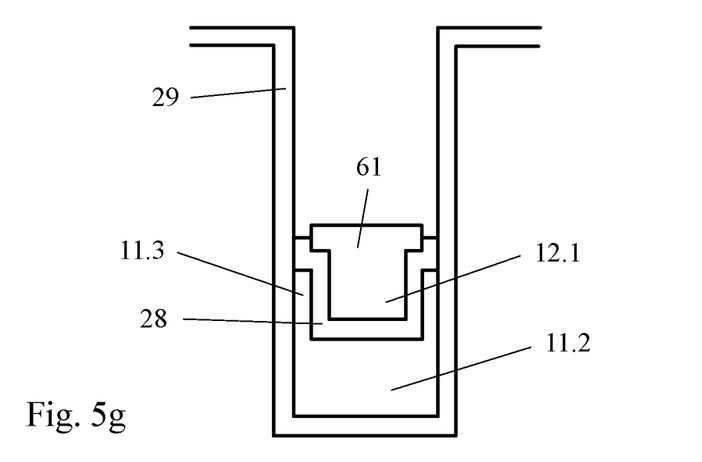
Figure 5H:
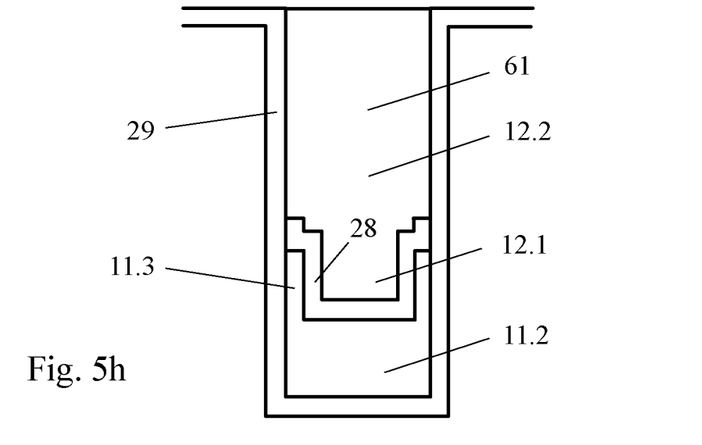

In FIG. 5f, the masking material 63 has been removed, and a layer 66 of a dielectric material 65 has been deposited. It covers a frontside of the semiconductor body 20 and a preliminary field electrode trench sidewall 62.2. In this example, the latter is identical to the preliminary field electrode trench sidewall 62.1 discussed above with reference to FIG. 5c. After the dielectric material deposition, again, a field electrode structure material 61 is deposited to fill the field electrode trench 7 completely. It is etched back subsequently to define the lower overlap section 12.1 of the second field electrode structure 12, namely to arrive at the structure shown in FIG. 5g. There, in addition, the layer 66 of the dielectric material 65 has been etched away to define a desired first dielectric thickness 21 for the coupling section 12.2 of the second field electrode structure 12. This coupling section 12.2 is formed by a further deposition of the field electrode structure material 61, as illustrated in FIG. 5h. In a subsequent etch back step, the desired height of the coupling section 12.2 is defined.

Figure 6:
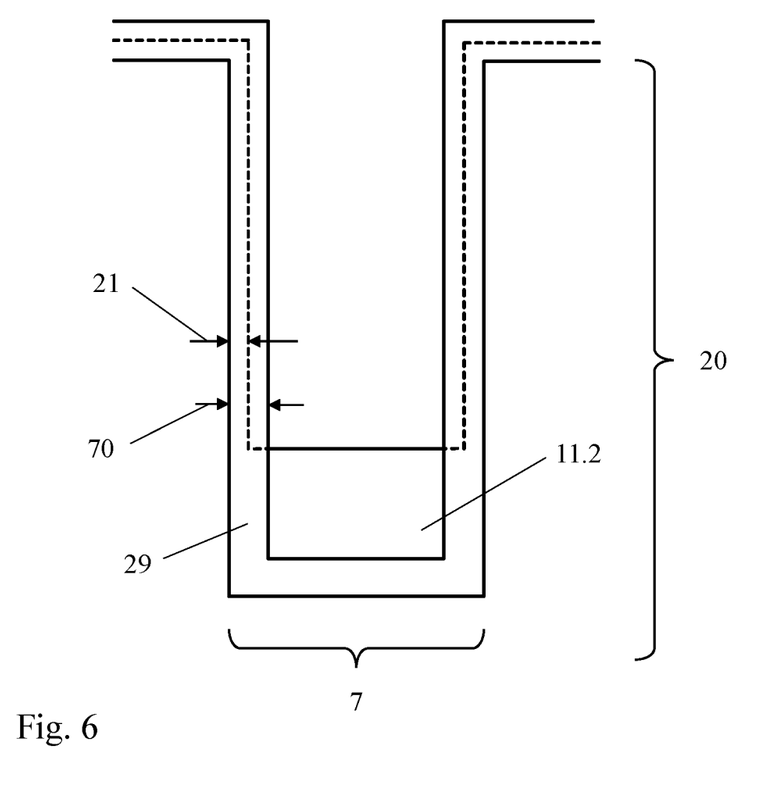
FIG. 6 illustrates some processing steps for manufacturing the field electrode structures of FIGS. 1 and 2 or 4.

FIG. 6 illustrates a process step that can be integrated between the steps shown in FIGS. 5b and c to manufacture an upper overlap section as illustrated in FIGS. 1/2 and 4. With an additional etch step, e.g. wet etching, the field dielectric 29 is etched back from its initial thickness 70 to the first dielectric thickness 21, see FIG. 2 in comparison. Subsequently, the field electrode structure material can be deposited and etched back as shown in FIGS. 5c-e to define the upper overlap section 11.3. Prior to the formation of the coupling section 12.2 of the second field electrode structure as illustrated in FIG. 5h, the field dielectric 29 can be reinforced again, e.g. by TEOS deposition, to arrive at the desired third dielectric thickness shown in FIG. 2.

Figure 7:
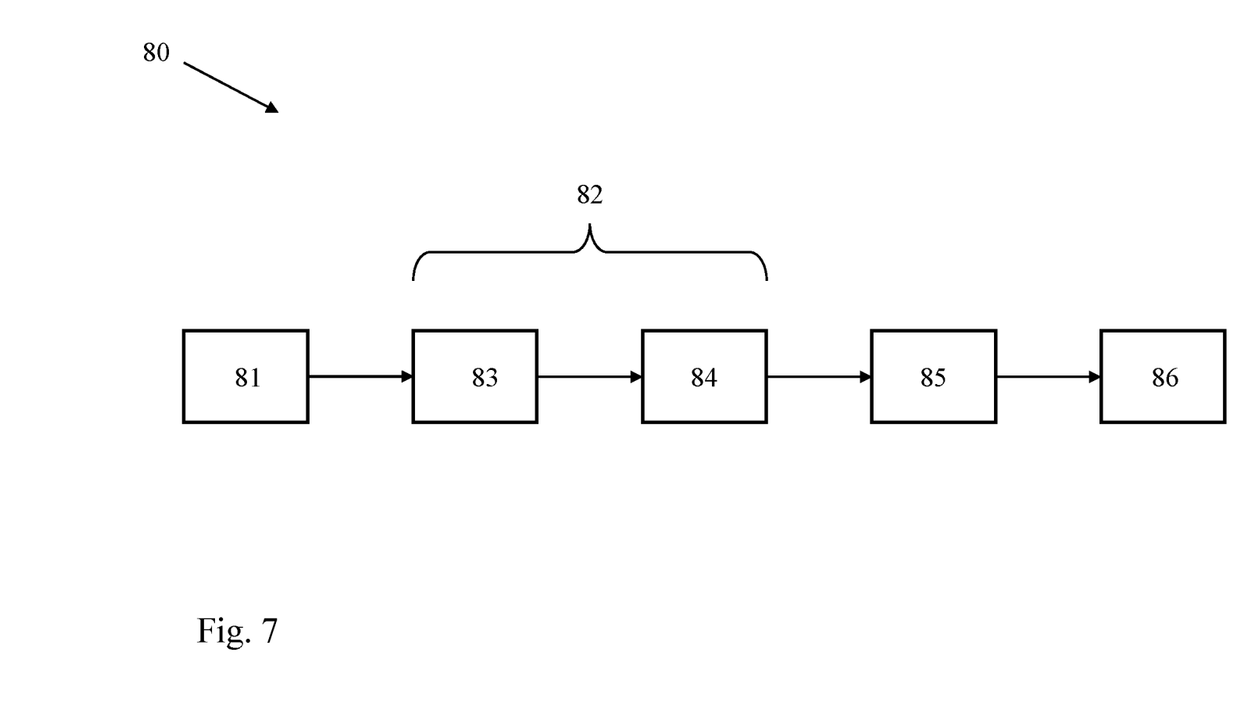
FIG. 7 shows a flow diagram summarizing some processing steps for manufacturing a power device disclosed here.

FIG. 7 summarizes some of the processing steps in a flow diagram 80 after etching 81 the field electrode trench 7, the first field electrode structure 11 is formed 82. This can in particular comprise a formation 83 of the coupling section 11.2 and a subsequent formation 84 of the upper overlap section 11.3, as discussed above. Thereafter, the dielectric material 65 is deposited 85 to form the dielectric layer 28, see FIG. 5f. Subsequently, the second field electrode structure 12 is formed 86, e.g. by a subsequent formation of the lower overlap section 12.1, the coupling section 12.2 and the upper overlap section 12.3.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power device, comprising:
   a channel region;
   a gate region aside the channel region and configured to control a channel formation;
   a drift region vertically below the channel region; and
   a field electrode in a field electrode trench vertically extending into the drift region,
   wherein the field electrode comprises a first and a second field electrode structure, the first field electrode structure capacitively coupling to a first section of the drift region and the second field electrode structure capacitively coupling to a second section of the drift region arranged vertically above the first section,
   wherein the first and the second field electrode structure are formed with a vertical overlap,
   wherein an upper overlap section of the first field electrode structure is arranged laterally outside a lower overlap section of the second field electrode structure, and
   wherein a dielectric thickness taken laterally between the upper overlap section of the first field electrode structure and the drift region is smaller than a dielectric thickness taken laterally between a coupling section of the first field electrode structure and the drift region.

2. The power device of claim 1, wherein in a vertical cross-section, an outer sidewall of the upper overlap section of the first field electrode structure is laterally offset outwards compared to an outer sidewall of a coupling section of the second field electrode structure, and wherein the coupling section of the second field electrode structure is formed on a larger vertical height than the lower overlap section of the second field electrode structure.

3. The power device of claim 1, wherein in a vertical cross-section, an outer sidewall of the upper overlap section of the first field electrode structure is laterally offset outwards compared to an outer sidewall of the coupling section of the first field electrode structure, and wherein the coupling section of the first field electrode structure is formed on a smaller vertical height than the upper overlap section of the first field electrode structure.

4. The power device of claim 1, wherein a dielectric thickness taken laterally between the upper overlap section of the first field electrode structure and the drift region is smaller than a dielectric thickness taken laterally between a coupling section of the second field electrode structure and the drift region.

5. The power device of claim 1, wherein a dielectric thickness taken laterally between the upper overlap section of the first field electrode structure and the drift region is smaller than a dielectric thickness taken laterally between the upper overlap section of the first field electrode structure and the lower overlap section of the second field electrode structure.

6. The power device of claim 1, wherein in the vertical cross-section, a vertical height of the coupling section of the first field electrode structure is larger than a lateral width of the upper overlap section of the first field electrode structure, and wherein the coupling section of the first field electrode structure is formed on smaller vertical height than the upper overlap section of the first field electrode structure.

7. The power device of claim 1, wherein the coupling section of the first field electrode structure is formed on a smaller vertical height than the upper overlap section of the first field electrode structure, and wherein the coupling section of the first field electrode structure has a vertical height which is between 0.2 and 10 times a vertical height of the upper overlap section of the first field electrode structure.

8. The power device of claim 1, wherein a dielectric thickness taken laterally between the upper overlap section of the first field electrode structure and the lower overlap section of the second field electrode structure is smaller than a dielectric thickness taken laterally between the coupling section of the first field electrode structure and the drift region.

9. The power device of claim 1, wherein a coupling section of the second field electrode structure is formed on a larger vertical height than the lower overlap section of the second field electrode structure, and wherein in the vertical cross-section, an outer wall face of the second field electrode structure extends obliquely between the lower overlap section of the second field electrode structure and the coupling section of the second field electrode structure.

10. The power device of claim 1, wherein a coupling section of the second field electrode structure is formed on a larger vertical height than the lower overlap section of the second field electrode structure, and wherein in the vertical cross-section, an outer wall face of the second field electrode structure extends with a step between the lower overlap section of the second field electrode structure and the coupling section of the second field electrode structure.

11. The power device of claim 1, wherein a doping concentration in the drift region has a gradient in at least one of the first section of the drift region and the second section of the drift region.

12. The power device of claim 1, further comprising:
a dielectric layer arranged between the first and the second field electrode structure where the vertical overlap is formed; and
a field dielectric formed between the field electrode and the drift region,
wherein the dielectric layer is made of a dielectric material other than the field dielectric formed between the field electrode and the drift region.

13. The power device of claim 1, wherein a capacity value between the first and the second field electrode structure is set to a capacity value between the first field electrode structure and a drain region of the power device.

14. The power device of claim 1, further comprising a resistor connected in parallel with a capacitor formed by the first and the second field electrode structure.

15. A power device, comprising:
a channel region;
a gate region aside the channel region and configured to control a channel formation;
a drift region vertically below the channel region; and
a field electrode in a field electrode trench vertically extending into the drift region,
wherein the field electrode comprises a first and a second field electrode structure, the first field electrode structure capacitively coupling to a first section of the drift region and the second field electrode structure capacitively coupling to a second section of the drift region arranged vertically above the first section,
wherein the first and the second field electrode structure are formed with a vertical overlap,
wherein an upper overlap section of the first field electrode structure is arranged laterally outside a lower overlap section of the second field electrode structure,
wherein in a vertical cross-section, an outer sidewall of the upper overlap section of the first field electrode structure is laterally offset outwards compared to an outer sidewall of a coupling section of the first field electrode structure, and
wherein the coupling section of the first field electrode structure is formed on a smaller vertical height than the upper overlap section of the first field electrode structure.

16. A power device, comprising:
a channel region;
a gate region aside the channel region and configured to control a channel formation;
a drift region vertically below the channel region; and
a field electrode in a field electrode trench vertically extending into the drift region,
wherein the field electrode comprises a first and a second field electrode structure, the first field electrode structure capacitively coupling to a first section of the drift region and the second field electrode structure capacitively coupling to a second section of the drift region arranged vertically above the first section,
wherein the first and the second field electrode structure are formed with a vertical overlap,
wherein an upper overlap section of the first field electrode structure is arranged laterally outside a lower overlap section of the second field electrode structure, and
wherein a dielectric thickness taken laterally between the upper overlap section of the first field electrode structure and the drift region is smaller than a dielectric thickness taken laterally between the upper overlap section of the first field electrode structure and the lower overlap section of the second field electrode structure.

17. A power device, comprising:
a channel region;
a gate region aside the channel region and configured to control a channel formation;
a drift region vertically below the channel region; and
a field electrode in a field electrode trench vertically extending into the drift region,
wherein the field electrode comprises a first and a second field electrode structure, the first field electrode structure capacitively coupling to a first section of the drift region and the second field electrode structure capacitively coupling to a second section of the drift region arranged vertically above the first section,
wherein the first and the second field electrode structure are formed with a vertical overlap,
wherein an upper overlap section of the first field electrode structure is arranged laterally outside a lower overlap section of the second field electrode structure,
wherein in a vertical cross-section, a vertical height of a coupling section of the first field electrode structure is larger than a lateral width of the upper overlap section of the first field electrode structure, and
wherein the coupling section of the first field electrode structure is formed on smaller vertical height than the upper overlap section of the first field electrode structure.

18. A power device, comprising:
a channel region;
a gate region aside the channel region and configured to control a channel formation;
a drift region vertically below the channel region; and
a field electrode in a field electrode trench vertically extending into the drift region,
wherein the field electrode comprises a first and a second field electrode structure, the first field electrode structure capacitively coupling to a first section of the drift region and the second field electrode structure capacitively coupling to a second section of the drift region arranged vertically above the first section,
wherein the first and the second field electrode structure are formed with a vertical overlap,
wherein an upper overlap section of the first field electrode structure is arranged laterally outside a lower overlap section of the second field electrode structure,
wherein a coupling section of the second field electrode structure is formed on a larger vertical height than the lower overlap section of the second field electrode structure, and
wherein in a vertical cross-section, an outer wall face of the second field electrode structure extends obliquely between the lower overlap section of the second field electrode structure and the coupling section of the second field electrode structure.

19. A power device, comprising:
a channel region;
a gate region aside the channel region and configured to control a channel formation;
a drift region vertically below the channel region; and
a field electrode in a field electrode trench vertically extending into the drift region, wherein the field electrode comprises a first and a second field electrode structure, the first field electrode structure capacitively coupling to a first section of the drift region and the second field electrode structure capacitively coupling to a second section of the drift region arranged vertically above the first section, wherein the first and the second field electrode structure are formed with a vertical overlap, wherein an upper overlap section of the first field electrode structure is arranged laterally outside a lower overlap section of the second field electrode structure, wherein a coupling section of the second field electrode structure is formed on a larger vertical height than the lower overlap section of the second field electrode structure, and wherein in a vertical cross-section, an outer wall face of the second field electrode structure extends with a step between the lower overlap section of the second field electrode structure and the coupling section of the second field electrode structure.

20. A power device, comprising:

a channel region;

a gate region aside the channel region and configured to control a channel formation;

a drift region vertically below the channel region; and a field electrode in a field electrode trench vertically extending into the drift region, wherein the field electrode comprises a first and a second field electrode structure, the first field electrode structure capacitively coupling to a first section of the drift region and the second field electrode structure capacitively coupling to a second section of the drift region arranged vertically above the first section, wherein the first and the second field electrode structure are formed with a vertical overlap, wherein a doping concentration in the drift region has a gradient in each of the first section of the drift region and the second section of the drift region, wherein the doping concentration in each respective section of the drift region increases from an upper end of a respective section toward a lower end of the respective section, and wherein the doping concentration decreases from the lower end of the second section toward the upper end of the first section.

* * * * *